United States Patent
Kleinberg

[15] 3,693,105
[45] Sept. 19, 1972

[54] ACTIVE TUNED CIRCUIT

[72] Inventor: Leonard L. Kleinberg, Greenbelt, Md.

[73] Assignee: The United States of America as represented by the Administrator of the National Aeronautics and Space Administration

[22] Filed: Jan. 18, 1971

[21] Appl. No.: 107,379

[52] U.S. Cl...................330/12, 331/115, 331/116 R, 333/80 T
[51] Int. Cl...................H03f 3/04
[58] Field of Search......330/12, 21, 31, 94, 107, 109; 307/295; 333/80 R, 80 T; 331/115, 116 R

[56] References Cited

UNITED STATES PATENTS

| | | | |
|---|---|---|---|
| 3,581,122 | 5/1971 | Gaunt | 330/94 X |
| 2,769,908 | 11/1956 | Stansel | 331/115 |
| 3,382,446 | 5/1968 | Carre | 330/31 |
| 3,483,477 | 12/1969 | Purnaiya et al. | 333/80 T X |

OTHER PUBLICATIONS

Appleby, " A Transistorized Resistance Capacitance Selective Network," Electronic Engineering, Nov. 1964, pp. 746- 749

*Primary Examiner*—Roy Lake
*Assistant Examiner*—James B. Mullins
*Attorney*—R. J. Kempf, Gerald M. Fisher and John R. Manning

[57] ABSTRACT

Active tuned circuit configurations particularly suitable for microelectronic construction as filters, amplifiers, and oscillators for operation near the $F_t$ of the transistors employed. A high Q, tunable network at a frequency near $F_t$ is provided by coupling a second bipolar transistor configuration to the emitter of a first bipolar transistor in order to provide negative resistance and capacitive reactance as necessary to tune the low Q inductive value of the first bipolar transistor.

9 Claims, 8 Drawing Figures

PATENTED SEP 19 1972

3,693,105

INVENTOR,
LEONARD L. KLEINBERG
BY Gerald M. Fisher
ATTORNEYS

PATENTED SEP 19 1972 3,693,105

SHEET 2 OF 3

INVENTOR,
LEONARD L. KLEINBERG
BY Gerald M. Fisher
ATTORNEYS

INVENTOR,
LEONARD L. KLEINBERG
BY
ATTORNEYS

ACTIVE TUNED CIRCUIT

ORIGIN OF THE INVENTION

The invention described herein was made by an employee of the United States Government and may be manufactured and used by or for the Government of the United States of America or for governmental purposes without the payment of any royalty thereon or therefor.

BACKGROUND OF THE INVENTION

Early interest in active filters was a result of the difficulty in making high quality inductors of reasonable size and weight for use at lower frequencies, i.e. 100 KHZ. This interest had received further impetus due to the development of microminiature techniques as a result of which, inductors which were once regarded as being of reasonable size were out of proportion with the rest of the circuitry. Today, in lower frequency applications, the disproportionate costs of making and connecting lumped inductors into microminiature circuits is even more important than the size factor. The early interest in active filters has now extended to higher frequency applications. It is at these higher frequency applications that this invention finds it most advantageous applications.

This invention is a valuable contribution to the field of microelectronics in that it enables the construction of low cost apparatus which will efficiently sustain frequency selective amplification or oscillation at frequencies near the $F_t$ of the transistors employed, which apparatus does not require the utilization of lumped inductors.

It is well known that the Q of all passive components, whether lumped or distributed, degrade with increasing frequency. As an example, a chip capacitor may exhibit a high Q at 10 MHZ but may have a low Q at 400 MHZ. Similarly, inductors become lossy and present undesirable stray capacitances at higher frequencies. In microelectronic circuits, to maintain high Q's at high frequencies, one must use extremely low-loss substrate materials with perfect surface finish, such as polished sapphire. Also, metallizations must be of proper resistivity and thickness and must have perfect geometrical definition. These requirements normally lead to high production costs. The present invention permits avoidance of many of these problems.

High power dissipation is common in conventional high-frequency amplifiers. Since $F_t$ of a transistor is a function of current, to achieve high frequency response for a given transistor it is customary to use high bias currents. Additionally, if an unconditionally stable circuit design is used, the gain per stage is necessarily considerably lower than that achieved by the present invention. This leads to a requirement for more stages and still higher power requirements. Furthermore, UHF and microwave circuits have a history of relatively high bias voltages and currents. All these effects combine to increase the power consumption above that required by the present invention.

Tuning, trimming and matching are well known and important considerations in microwave circuit design. Conventionally, stub tuners and large variable capacitors are utilized. Individual tailoring of circuit values is usually necessary. However, in hybrid circuits adding and removing tuning resistors and capacitors is very costly. High power pulsing, laser or abrasive techniques have been used for trimming of thick and thin film components. Each of these techniques is irreversible, a problem which is sometimes not acceptable. In the present invention, approximate performance characteristics can be achieved by the adjustment or selection of passive elements. Fine tuning could be accomplished electronically. Electronic tuning also provides a convenient approach for temperature compensation and stabilization.

Another prime advantage of the present invention is the cost savings which arise from the mode of utilizing the transistors employed therein. In conventional circuit design, a transistor is used in an amplifier or other circuits at a frequency well below its transitional frequency ($F_t$), usually less than $F_{t/4}$, since conventional design technique dictates use where the transistor power gain versus frequency characteristic is a constant. In contradistinction, the present invention requires the use of the transistors in the region of their characteristic where the power gain vs. frequency displays a rolloff characteristic, and where the transistor itself contributes a phase shift which makes possible the impedance transformations. Utilization of this characteristic of the transistor forms the basis for the present invention. Accordingly, the present invention makes possible the high frequency use of transistors having transitional frequencies which would conventionally limit that transistor to lower frequency work.

Since high frequency transistors are more expensive, i.e. transistors with $F_t$ greater than (500 MHZ) are more expensive than those having an $F_t$ conventionally for lower frequency work, a great savings can be realized by practice of this invention which provides for use of transistors at high frequencies which transistors were traditionally believed useful only at lower frequencies.

PRIOR ART

The phase shift through a transistor has been known for some time, but only a lower value Q was generally realizable with such arrangements. U.S. Pat. No. 2,820,145 to Wolfendale discloses the use of the transit time effect of a single transistor in combination with an emitter capacitor to generate a negative resistance and capacitive reactance as its base. In order to tune, Wolfendale shows the inclusion of lumped inductors. The Stansel patent (U.S. Pat. No. 2,769,908) discloses the same means as the Wolfendale patent for generation of negative resistance for an input circuit looking into the base electrode of a transistor. Stansel also recognized that the transistor could also present a negative capacitance (inductance) where the input terminal was connected to the emitter. Both of these investigators recognized that these effects were operative near the transitional frequency of the transistor. However, the transistor models which were used by Stansel and others caused the impression that the maximum achievable Q was less than 1. Furthermore, since the models for transistor operation which were used to analyze such transistor circuits have proven to be incorrect, no prior art investigators were able to understand or predict the manner in which the parameters were dependent on frequency.

There were a few investigators who attempted to combine negative resistance effects created by avalanche mode operation of a transistor in order to increase the Q of inductive transistors similar to those of Wolfendale and Stansel. However, all such attempts lead to high noise, and excessive power dissipation. Transistor parameters were multiplied by the negative resistance effects causing problems of device control and temperature stability. Accordingly, the inductive and negative resistance effect of transistors have remained a mere laboratory curiosity.

It is the object of the present invention to provide simplified inductorless tuned circuitry utilizing the principle of impedance rotation, which principle has application at any frequency.

Another object of the invention is to provide a tuned circuit which is completely manufacturable by microelectronic techniques.

Another object is to provide easily designable circuitry for filters, matching networks, amplifiers and oscillators which can operate more advantageously at higher frequencies than previously believed practical for the transistors employed, thus allowing highest frequency operation for a given power consumption and cost.

Another object is to provide circuitry advantageously fabricated by microelectronic techniques having tuning capability for operation at frequencies near the transitional frequency ($F_t$) of the transistors employed.

Another object is to provide circuits which have a noise factor approximating the inherent noise of the transistors employed and which operate at very low power requirements.

SUMMARY OF THE INVENTION

The applicant has provided a unique means of combining transistors and other realizable parameters so as to obtain a tuning capability manually or electronically, which makes possible numerous electronic circuits which can be frequency selective or broadband at frequencies near and above $F_{t/2}$ of the transistors employed in the circuits.

A more complete understanding of the invention may be obtained from the following detailed description of a specific embodiment of the invention.

Figure 1:
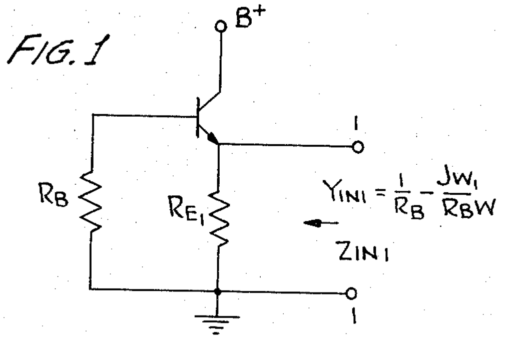
FIG. 1 is a schematic of an inductive impedance rotator.
Figure 2:
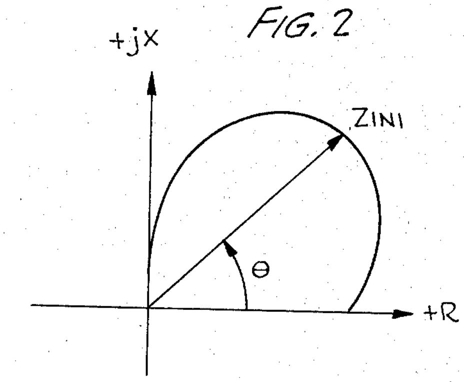
FIG. 2 is a frequency domain plot for the $Z_{in1}$ of FIG. 1.

It can be shown that when a bi-polar transistor in the configuration shown in FIG. 1 is operated near its transitional frequency ($F_t$) it will exhibit inherent phase shifts due to base transit time effects. The transitional frequency, $F_t$ is commonly defined as the frequency at which the common emitter current gain of the transistor is unity. By the insertion of additional passive elements connected to the emitter of such a configuration, additional phase shifts can be introduced which combine with the phase shift of the transistor. Accordingly, the impedance $Z_{in1}$ as shown in FIG. 1 looking into the emitter circuit can be shown to be a complex positive phase angle impedance as shown by the frequency domain plot of FIG. 2. At the frequencies close to $F_t$ of the transistor the emitter circuit appears as an RL circuit with a Q typically in the order of 1–2 depending upon the operating frequency. It has been discovered that by combining certain appropriate auxiliary circuits, these low Q's may be raised to high values in a manner which retains stability and affords many other advantages.

Figures 3, 4, 5:
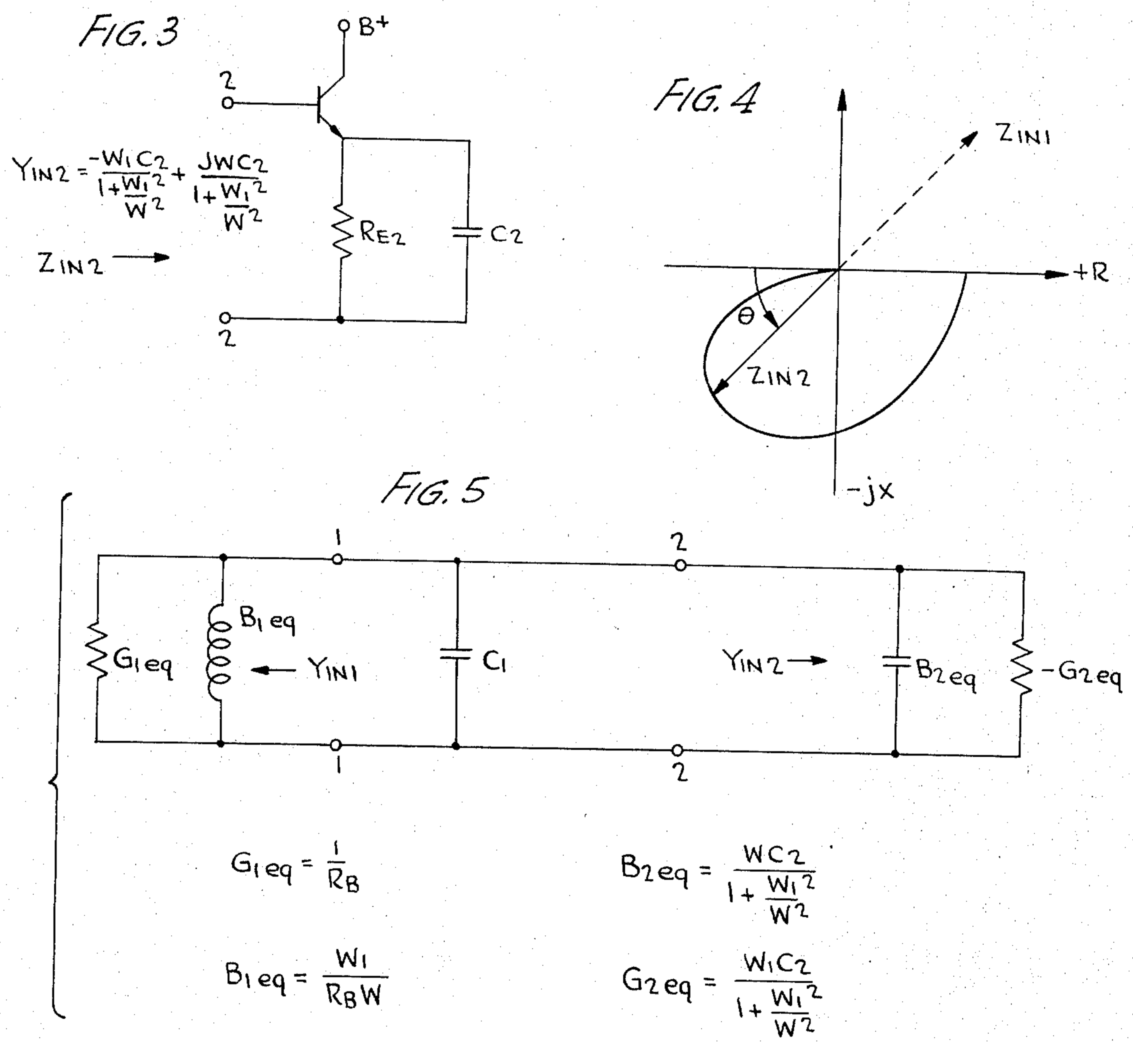
FIG. 3 is a schematic of a second −R, c impedance rotator.
FIG. 4 is a frequency domain plot for the $Z_{in2}$ of FIG. 3.
FIG. 5 is the equivent circuit diagram of the combination of FIG. 1 and FIG. 3.

One of the advantageous features of the present invention is that the auxiliary circuits which are added for tuning take the same form as the transistor circuit being tuned; namely, the auxiliary circuits comprise a transistor as shown in FIG. 3 configuration including the same passive elements inserted into its emitter circuit as the transistor being tuned.

In its most desirable aspect, the present auxiliary circuits of the invention take the configuration in which a capacitor is connected in parallel with the emitter bias lumped resistor. If the impedance of the emitter load is properly chosen, the input impedance $Z_{in2}$ as shown in FIG. 3 looking into the base of the auxiliary transistor, will exhibit a negative resistance and a capacitive reactance near the transitional frequency. By connecting this negative resistance and capacitive reactance of the second transistor into the emitter circuit of the first low Q transistor, selective tuning and high Q's are made possible.

Figure 6:
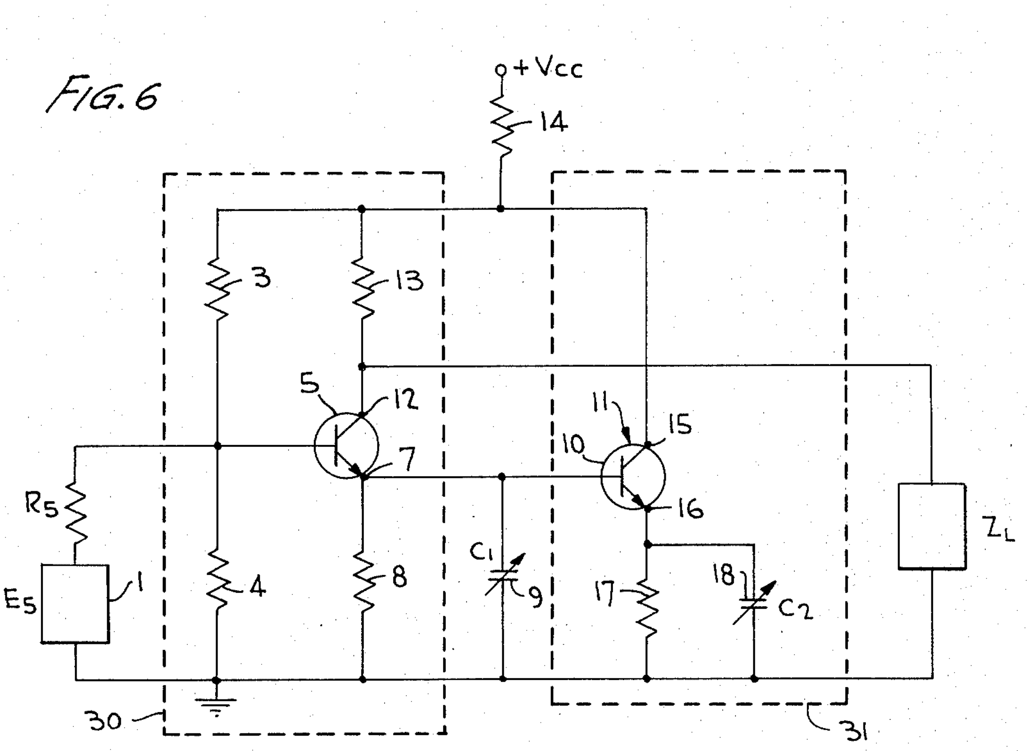
FIG. 6 is the schematic diagram of a preferred embodiment.

FIG. 5 is the equivalent circuit at frequencies near the transitional frequency of the circuit obtained by connecting terminals 1-1 of FIG. 1 to terminals 2-2 of FIG. 3 where the capacitor $C_1$ is an external tuning capacitor corresponding to the variable capacitor 9 in the preferred embodiment of FIG. 6. Considering only the dominant terms (neglecting the effects of $R_{E1}$, $R_{E2}$, and the internal parameters of the transistor) the dominant admittance ($Y_D$) as seen across $C_1$ of FIG. 5 is given by equation (1).

$$(1)\quad Y_D = Y_{in1} + Y_{in2} + jWc_1$$

$$(2)\quad Y_D = \frac{1}{R_B} - \frac{W_1 C_2}{1+\frac{W_1^2}{W^2}} - \frac{jW_1}{R_B W} + jWC_1 + \frac{jWC_2}{1+\frac{W_1^2}{W^2}}$$

Assuming an infinite Q, namely that the sum of the real and imaginary parts of $Y_D$ go to zero, we can determine the frequency of oscillation ($F_{OSC}$) and the starting conditions in terms of $F_1$, where $F_1$ is a constant defined herein as the Upper Frequency Limit for a given transistor under a given bias condition. Namely, $$(3)\quad F_{OSC} = \frac{F_1}{(1+2\pi F_1 R_B C_1)^{1/2}}$$

where $F_1$ is defined by the equation $$(4)\quad F_1 = \frac{1}{\pi R_B (C_2 - C_1)}$$

$F_1$ is a measure of the transitional frequency of a transistor ($F_t$) but is not identical thereto.

From equation (3) it can be seen that selective tuning can be accomplished by appropriate choice of external parameters $R_B$, $C_2$ and $C_1$. Experience has shown however that tuning by such external parameter selection for operation according to this invention is substantially limited to the region between $F_1$ and $F_{one\text{-}half}$. The manner of determining the value of $F_1$ for a given transistor and bias condition is described infra.

DETAILED DESCRIPTION OF THE PREFERRED EMBODIMENT

The schematic of the preferred embodiment of the invention is shown in FIG. 6. An external signal source LS having resistance $R_S$ is shown connected to the junction of the resistive divider formed of resistors 3 and 4 and to the base 6 of the first NPN transistor 5. The emitter 7 is connected to emitter resistor 8, capacitor 9 and base electrode 10 of NPN transistor 11. Collector 12 of transistor 5 is connected through collector resistor 13 to divider resistor 3, power supply resistor 14, and to the collector 15 of second transistor 11. The output, taken from the collector 12 of transistor 5, is connected across an external load impedance $Z_L$. Emitter 16 of transistor 11 is connected through resistor 17 and capacitor 18 to ground.

During the development of the present invention it has been determined that conventional high frequency models for transistors did not enable usable predictions for the operation of the circuits employing the impedance rotation features of this invention. It has also been determined that it is practically impossible to achieve the advantageous characteristic performance of these circuits by an ordinary bench type of trial and error fine tuning technique. Accordingly, a new high frequency model utilizing a new more appropriate high frequency response of the transistor was developed for analyzing and determining circuit values for circuits employing the concepts of the applicant's invention. The model employed includes all internal and external parameters and has enabled reliable prediction of the range of operation and component values necessary to achieve a desired tuning. It has become clear that circuits in accordance with the invention are capable of extremely high Q operation when properly terminated. It is also clear that the proper operation of the circuit is extremely elusive in the sense that it occurs over a relatively narrow frequency range and for carefully selected component and bias conditions.

When using the circuits of this invention for their amplification characteristics, there are many different means by which the driving source and/or load may be connected to the circuit. However, connection of the load to the collector of the first transistor 5 of FIG. 6 provides better isolation from the basic tuning mechanism of the invention and improved noise figure. The preferred embodiment shown in FIG. 6 is exemplary of an amplifier configuration for use with an external driving source having a low impedance.

Considering only the dominant terms, by writing the voltage gain equation of the amplifier, and applying the criteria for oscillation, the frequency of oscillation and the starting conditions may be obtained for the FIG. 6 embodiment. Namely, (5)
$$F_{OSC}=\frac{F_1(C_2-C_1)}{C_1+C_2}$$

(6)
$$F_1=\frac{C_2^2(C_1+C_2)}{\pi Rs(C_2^4+2C_1^4+2C_1^3C_2-C_1^2C_2^2)}$$

It can be shown that when $C_1$ equals zero, that these equations reduce to $$F_{OSC}=F_1 \text{ and}$$

$$F_1=(1/\pi RsC_2)$$

where Rs is the source resistance.

The power gain for an output taken from the collector of the first transistor is extremely complicated for direct analysis, but it can be approximated by the expression.

$$\text{Power Gain}=20\log_{10}Q$$

where Q is typically 100–200.

A method has been devised whereby a measurement can be performed to determine the Upper Frequency Limit, $F_1$ which determination will enable a designer to determine the frequency band over which a specific transistor type will operate according to this invention. Additionally this measurement enables the determination of the bounds of the parameters in order to design amplifiers or other circuits. The band of operable frequencies and bounds of the parameters determined by this measurement technique may be sufficient to support the design requirements utilizing this invention at frequencies under 1 GHZ. Above 1 GHZ, a combination of the measurement technique with computer-aided calculations is necessary. This measurement procedure is necessary to implement this invention because there are presently no manufacturers who provide accurate data as to the model of their transistors or to their parameters.

The procedure is simple. Connect a pair of transistors whose $F_1$ is desired into the circuit of FIG. 6. Preferably the transistors or chips were chosen from the same manufactured batch so that their characteristics are closely matched. This is a requirement generally met by all transistors made on the same wafer. By setting $C_1$ of FIG. 6 to zero, and by adjusting $R_B$ and $C_2$ for oscillation, we can determine $F_1$, since equation (3) discloses that when $C_1=0$, $F_{OSC}=F$.

For purposes of this invention, $F_1$ is the primary parameter of interest in that it defines the Upper Frequency Limit at which a given transistor will operate according to this invention. Other techniques for determining $F_1$ have been utilized where the characteristics of the transistors of interest are not closely matched. For example, where the transistors have Upper Frequency Limits which are not equal but which are relatively close to each other, the frequency of oscillation ($F_{OSC}$) becomes the geometric mean ($F_M$).

$$F_M=\sqrt{F_{11}F_{12}}$$

where $F_{11}$ is the Upper Frequency Limit for the first transistor, $F_{12}$ is the Upper Frequency Limit for the second transistor.

It has also been shown that tuning of the applicant's invention can be accomplished by varying the $F_1$ of one or both of the transistors. However, since $F_1$ enters the real and imaginary parts of the condition for high Q in a complicated way, it is more difficult to calculate the values of $F_1$ to produce a gain change at a given frequency. In addition, since the means of changing $F_1$ requires a change of bias currents, practically all other transistor parameters are also changed, so that the net tuning effects is a combination of all these effects. Accordingly, while bias tuning of $F_1$ is workable, the calculations must be based on Y or scattering parameters of the transistors as a function of bias conditions rather than being based on high frequency transistor models.

The response of those circuits built according to the applicant's invention have demonstrated a low noise figure, i.e. a two transistor RF amplifier using 2N918 transistors at 600 MHZ, using 35 MW of power, at a power gain of 35 db had a noise figure of less than 6 db. The manufacturer's specification for the noise figure for this transistor is typically 9–11 db at 600 MHZ. While this low noise characteristic is not entirely understood, preliminary noise analysis shows that a definite reduction in noise figure takes place at the frequency of the peak voltage gain if the circuit is tuned to high Q. This reduction in noise figure is directly related to the fact that the input impedance becomes extremely small at the high Q point resulting in a substantial increase in the factors in the denominator of the noise figure equations, thereby resulting in a much improved noise figure.

Physically, it has been discovered that circuits built according to this invention exhibit better center frequency stability over a broad temperature range than conventional RF circuits. Although the temperature stability relationships have not been fully analyzed, this effect is believed to be dependent upon the fact that the inventive operation is primarily dependent upon the passive components. Since high quality resistive and capacitive components having low temperature coefficients are readily available, these circuits exhibit improved temperature stability.

Many variations of the circuits of FIG. 6 which take advantage of the characteristics of this combination are possible. Specifically, frequency sweeping of an amplifier constructed in accordance with the applicant's invention has also been demonstrated by controlled variation of the R & C values of the interstage network lending itself to applications as a search receiver.

Figure 7:
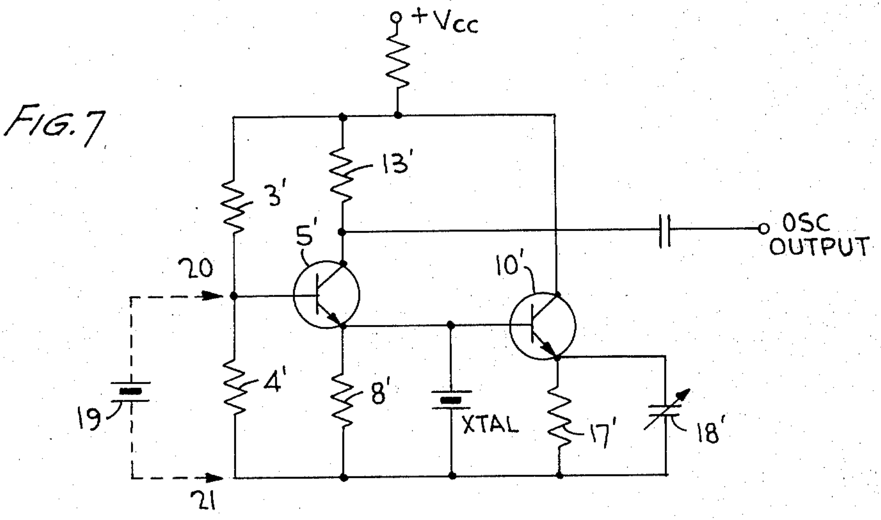
FIG. 7 is a schematic of an oscillator according to the invention.

As an oscillator, it has been shown that a crystal oscillator according to the configuration of FIG. 7, which is similar to a free running oscillator in the configuration of FIG. 6 except for the substitution of a crystal (XTAL) for the capacitor of FIG. 6 in the interstage network, has an enhanced temperature and frequency stability by virtue of the inherent nature of the mode of operation of the circuit. Naturally, many variations in the location of the crystal in this oscillator and the point from which the output signal is extracted is possible depending on the drive requirements of the crystal. For example, the crystal could also be placed across resistor 4' as shown in dashed lines of FIG. 7.

Figure 8:
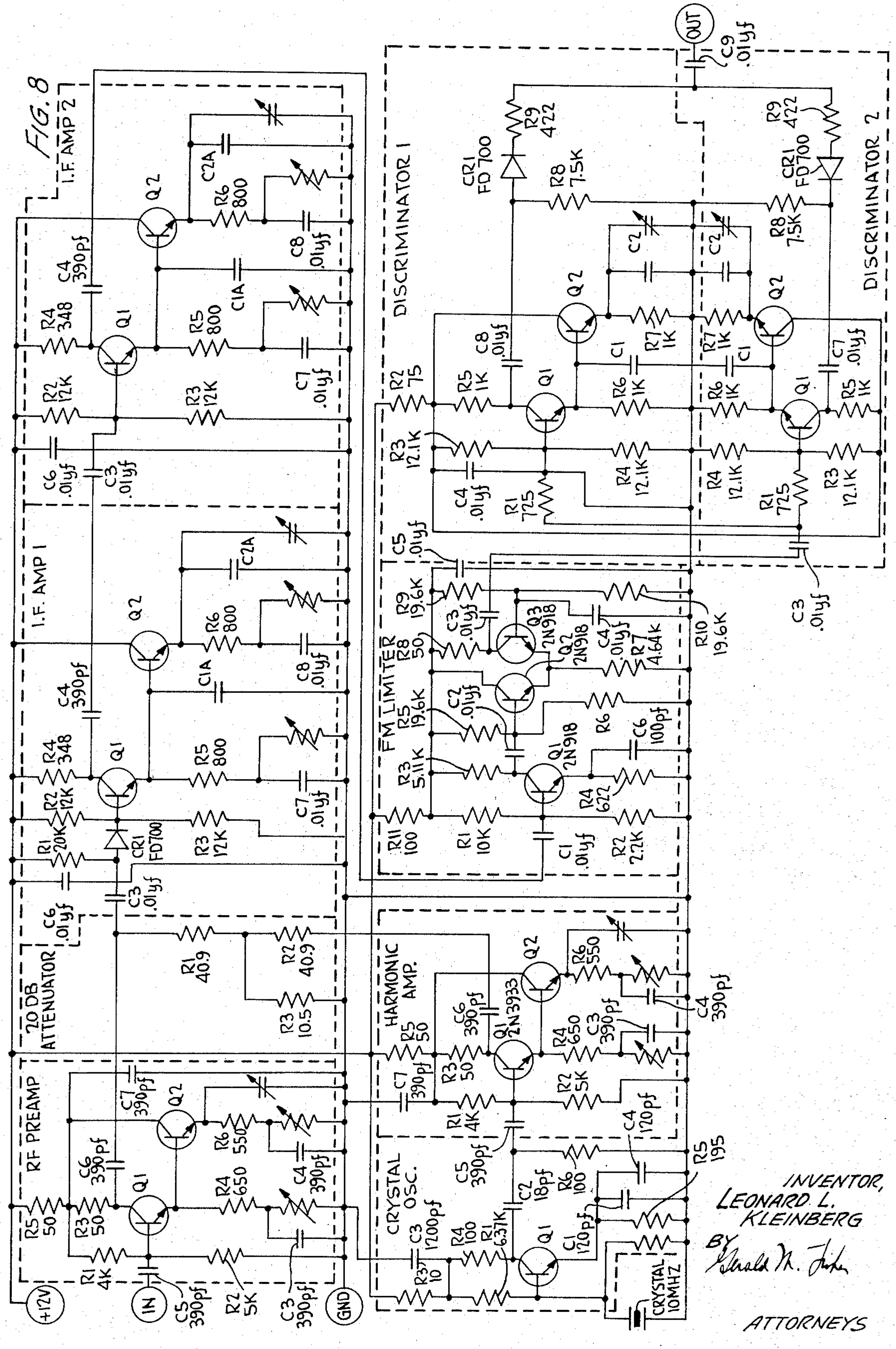
FIG. 8 is a schematic of an entire FM receiver wherein many circuits are made according to the invention.

As has been explained, the invention as described herein, lends itself to the fabrication of microelectronic circuits without inductors which circuits are realizable at all frequencies, but which are particularly useful at high frequencies. Although each possible circuit arrangement has not been discussed in detail, it has been physically demonstrated that the single configuration of the invention described by FIG. 6 can be tuned and combined to provide all the circuit components of an FM radio receiver, including the RF preamplifier, oscillator, harmonic amplifier mixer, IF amplifiers and double tuned limiter-discriminator. The schematic of such an inductorless 400 MHZ FM receiver made by integrated circuit techniques is shown in FIG. 8. It should be noted that these circuits avoid the need for input and output matching networks. This is a feature of this invention because the input and output impedance levels of these circuits are relatively close in value so that the circuits are inherently compatible without elaborate matching.

While specific embodiments have been described for purpose of explaining the invention, the invention is not so limited and modifications and variations thereof should be obvious to those skilled in the art.

What is claimed as new to be secured by Letters Patent of the United States is:

1. In an inductorless active tuned network, the improvement comprising:

a first means for rotating impedances having a first output including a first transistor having an Upper Frequency Limit $F_1$, said first means being tunable from said upper Frequency Limit ($F_1$) of said transistor to nearly one half said Upper Frequency Limit to present an admittance having a real conductance and inductive susceptance across said first output;

a second means for rotating impedances having a second output including a second transistor having said Upper Frequency Limit ($F_1$), said second means being tunable from said Upper Frequency Limit ($F_1$) of said second transistor to nearly one half said Upper Frequency Limit to present an admittance having a negative conductance and an capacitive susceptance across said second output;

means connecting said output of said first impedance rotating means and said output of said second impedance rotating means in parallel; and means for energizing said first and second impedance rotating means.

2. In a network according to claim 1, wherein said first impedance rotating means includes a first resistor, said first transistor having emitter, base and collector electrodes, said first output of said first impedance rotating means is taken across said first resistor connected between the emitter of said first transistor and ground and wherein the base of said first transistor is resistively coupled to ground; and wherein said second impedance rotating means includes a parallel circuit comprising a second resistor and a first capacitor, said second transistor having emitter, base and collector electrodes, said second output of said second impedance rotator being taken from said base electrode of said second transistor to ground, said emitter of said second transistor being connected to ground through said parallel circuit.

3. In an inductorless active tuned network for operation near the transitional frequency of the active elements, said network comprising:

a first semiconductor means having a first pair of output terminals and a frequency characteristic near its transitional frequency such that a phase shift is produced between current and voltage therein;

means for energizing said first semiconductor means whereby said first semiconductor means exhibits an output impedance looking into said first pair of output terminals being comprised of real resistance and inductive reactance;

a second semiconductive means having a second pair of output terminals and having a frequency characteristic near its transitional frequency such that a phase shift is produced between current and voltage therein;

means for energizing said second semiconductive means such that said phase shift of said second semiconductive means exhibits an output impedance looking into said second pair of output terminals comprised of negative resistance and capacitive reactance; and means for connecting said output of said first semiconductive means to said output of said second semiconductive means.

4. In an inductorless network as defined by claim 3 further including:

a tuning capacitor, said tuning capacitor being connected across said output terminals of both said first and second semiconductor means.

5. An inductorless network as defined by claim 3 wherein said first semiconductor means includes a transistor having a base, emitter and collector electrodes, said base electrode being coupled to a common voltage terminal through a first resistor, said emitter electrode being connected to said common voltage terminal through a second resistor, said collector being resistively coupled to a terminal adapted to receive a source of power, said collector electrode providing a tap for connection to external circuits.

6. An inductorless network as defined by claim 5 wherein said network provides a highly amplified signal at said tap of the frequency components near said transitional frequency of a lower level signal applied to said base electrode of said transistor of said first semiconductor means.

7. An inductorless active tuning circuit comprising: first and second bipolar transistors each having emitter, base and collector electrodes, with the emitter electrode of said first transistor connected to the base electrode of said second transistor;

a first network including a resistive element coupled between the emitter electrode of said first transistor and a reference potential;

a second network including a resistive element in parallel with a capacitor coupled between the emitter electrode of said second transistor and said reference potential;

means in circuit with its collecter and base electrodes to operate said first transistor rear its transitional frequency to produce an impedance equivalent to $R+jx$ between its emitter electrode and said reference potential; and means in circuit with its collector electrode to operate said second transistor rear its transitional frequency to produce an impedance equivalent to $-R-jx$ between its base electrode and said reference potential.

8. An inductorless active tuning circuit according to claim 7 and further including a capacitor in parallel with the resistive element of said first network.

9. An inductorless active tuning circuit according to claim 7 and further including a crystal in parallel with the resistive element of said first network.

* * * * *